US012696501B2

(12) United States Patent
Dorow et al.

(10) Patent No.: US 12,696,501 B2
(45) Date of Patent: Jul. 28, 2026

(54) SEEDED GROWTH FOR 2D NANORIBBON TRANSISTORS

(71) Applicant: Intel Corporation, Santa Clara, CA (US)

(72) Inventors: Chelsey Dorow, Portland, OR (US); Carl H. Naylor, Portland, OR (US); Kirby Maxey, Hillsboro, OR (US); Kevin O'Brien, Portland, OR (US); Ashish Verma Penumatcha, Beaverton, OR (US); Chia-Ching Lin, Portland, OR (US); Uygar Avci, Portland, OR (US); Matthew Metz, Portland, OR (US); Sudarat Lee, Hillsboro, OR (US); Ande Kitamura, Portland, OR (US); Scott B. Clendenning, Portland, OR (US); Mahmut Sami Kavrik, Eugene, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 18/091,206

(22) Filed: Dec. 29, 2022

(65) Prior Publication Data

US 2024/0222428 A1     Jul. 4, 2024

(51) Int. Cl.
| | |
|---|---|
| *H10D 62/10* | (2025.01) |
| *H10D 30/47* | (2025.01) |
| *H10D 30/67* | (2025.01) |
| *H10D 62/13* | (2025.01) |
| *H10D 62/40* | (2025.01) |
| *H10D 62/86* | (2025.01) |

(Continued)

(52) U.S. Cl.
CPC ........... *H10D 62/121* (2025.01); *H10D 30/47* (2025.01); *H10D 30/6757* (2025.01); *H10D 62/151* (2025.01); *H10D 62/40* (2025.01); *H10D 62/86* (2025.01); *H10D 84/0128* (2025.01); *H10D 84/038* (2025.01); *H10D 84/834* (2025.01)

(58) Field of Classification Search
CPC .. H10D 62/121; H10D 30/47; H10D 30/6757; H10D 62/151; H10D 62/40; H10D 62/86; H10D 84/0128; H10D 84/038; H10D 84/834; H10D 30/6735
See application file for complete search history.

(56) References Cited

U.S. PATENT DOCUMENTS

| | | | | |
|---|---|---|---|---|
| 10,756,215 B2* | 8/2020 | Kloster | .............. | H10D 30/6211 |
| 11,056,574 B2* | 7/2021 | Wostyn | ................ | H10D 84/017 |

(Continued)

*Primary Examiner* — John P. Dulka

(74) *Attorney, Agent, or Firm* — Essential Patents Group, LLP

(57) ABSTRACT

A transistor has multiple channel regions coupling source and drain structures, and a seed material is between one of the source or drain structures and a channel material, which includes a metal and a chalcogen. Each channel region may include a nanoribbon. A nanoribbon may have a monocrystalline structure and a thickness of a monolayer, less than 1 nm. A nanoribbon may be free of internal grain boundaries. A nanoribbon may have an internal grain boundary adjacent an end opposite the seed material. The seed material may directly contact the first of the source or drain structures, and the channel material may directly contact the second of the source or drain structures.

20 Claims, 10 Drawing Sheets

(51) Int. Cl.
    *H10D 84/01*      (2026.01)
    *H10D 84/03*      (2025.01)
    *H10D 84/83*      (2025.01)

(56)            References Cited

U.S. PATENT DOCUMENTS

| | | | |
|---|---|---|---|
| 11,469,252 B2* | 10/2022 | Park | H10B 51/20 |
| 11,515,297 B2* | 11/2022 | Ahmed | H10W 90/00 |
| 2021/0376134 A1* | 12/2021 | Chen | H10D 48/362 |
| 2021/0391362 A1* | 12/2021 | Lee | H10F 39/807 |

* cited by examiner

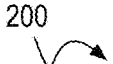
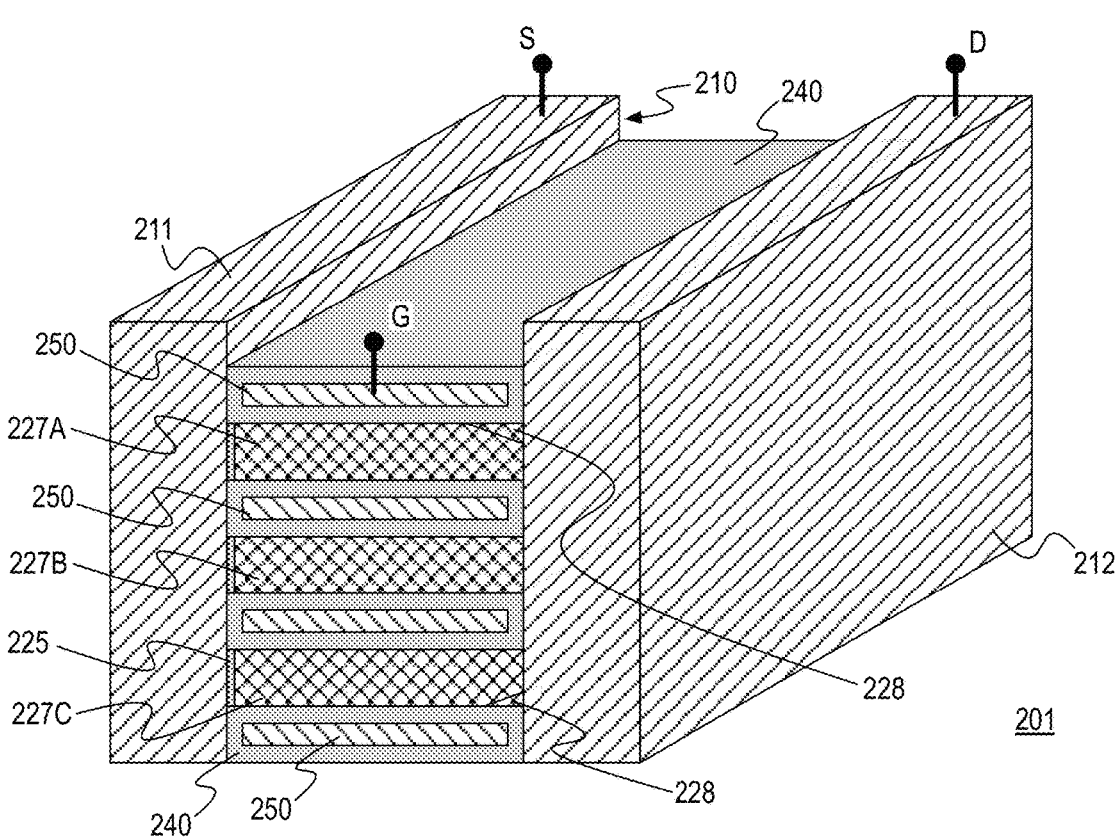
FIG. 2G

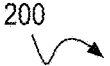
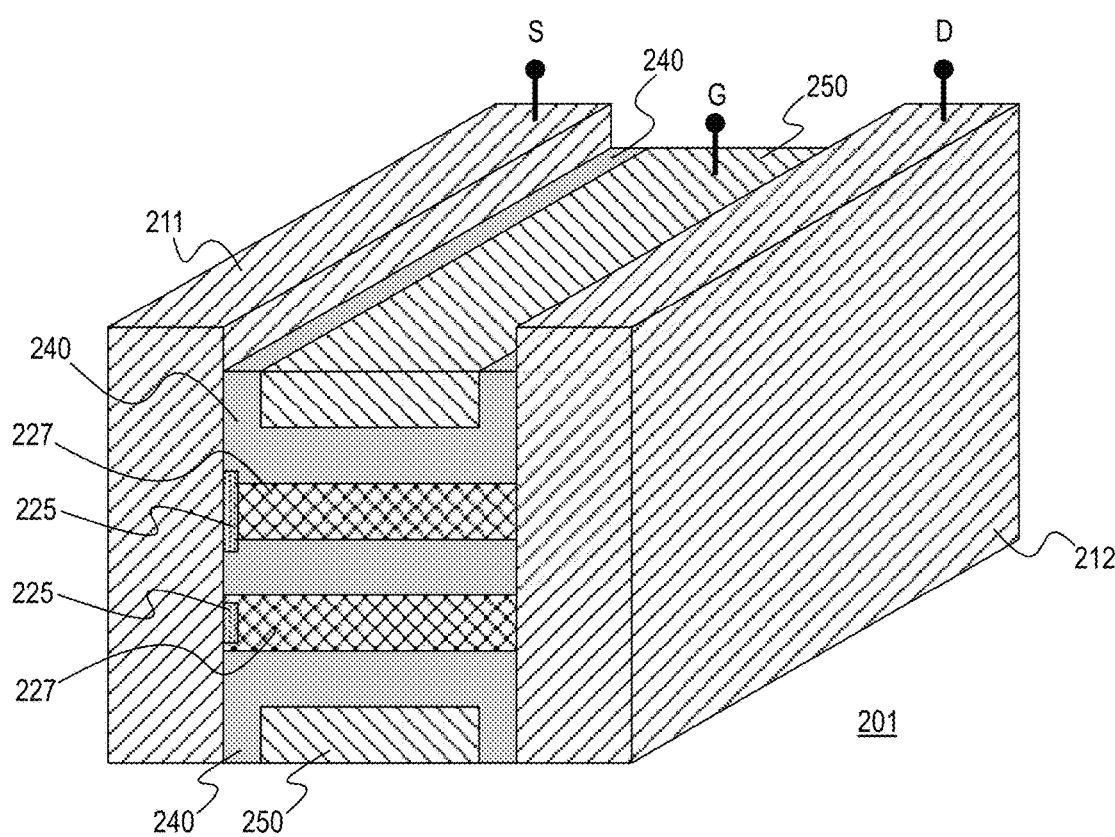
FIG. 3

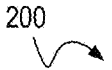
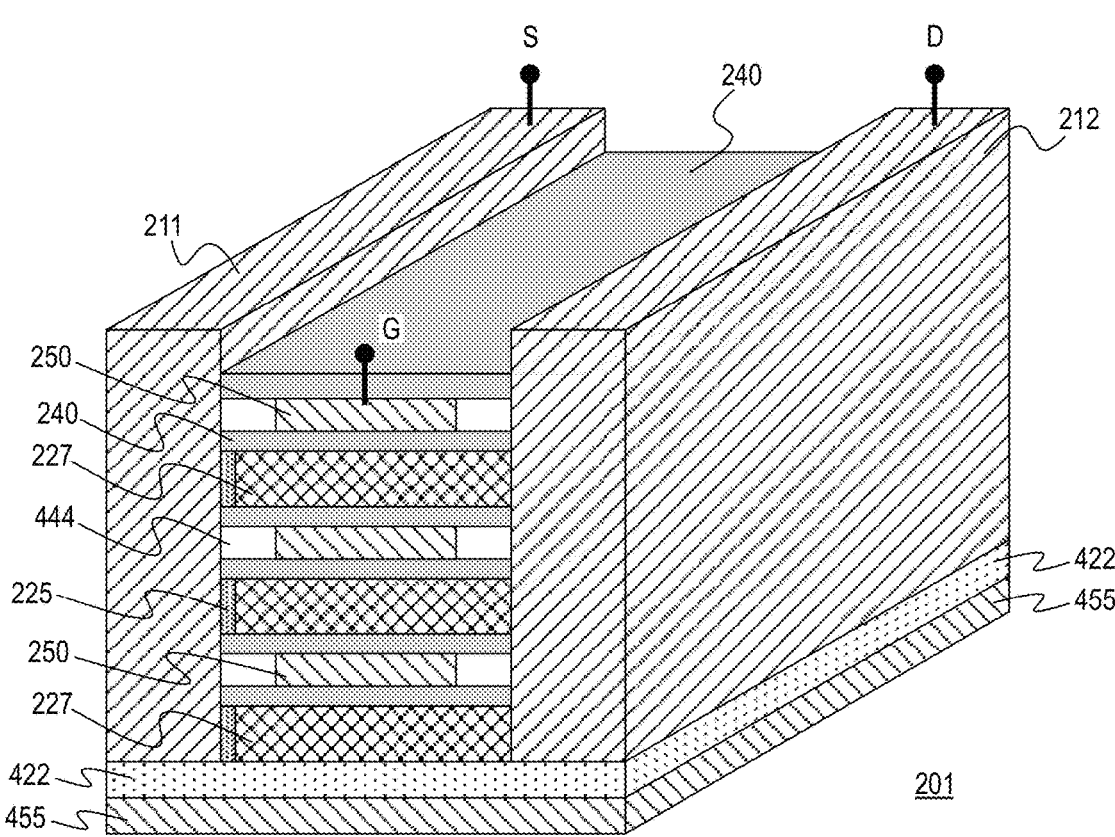
FIG. 4

500

200

S

D

240

211

240

G

250

225

240

227

250

225

212

228

201

250

240

227

250

240

599

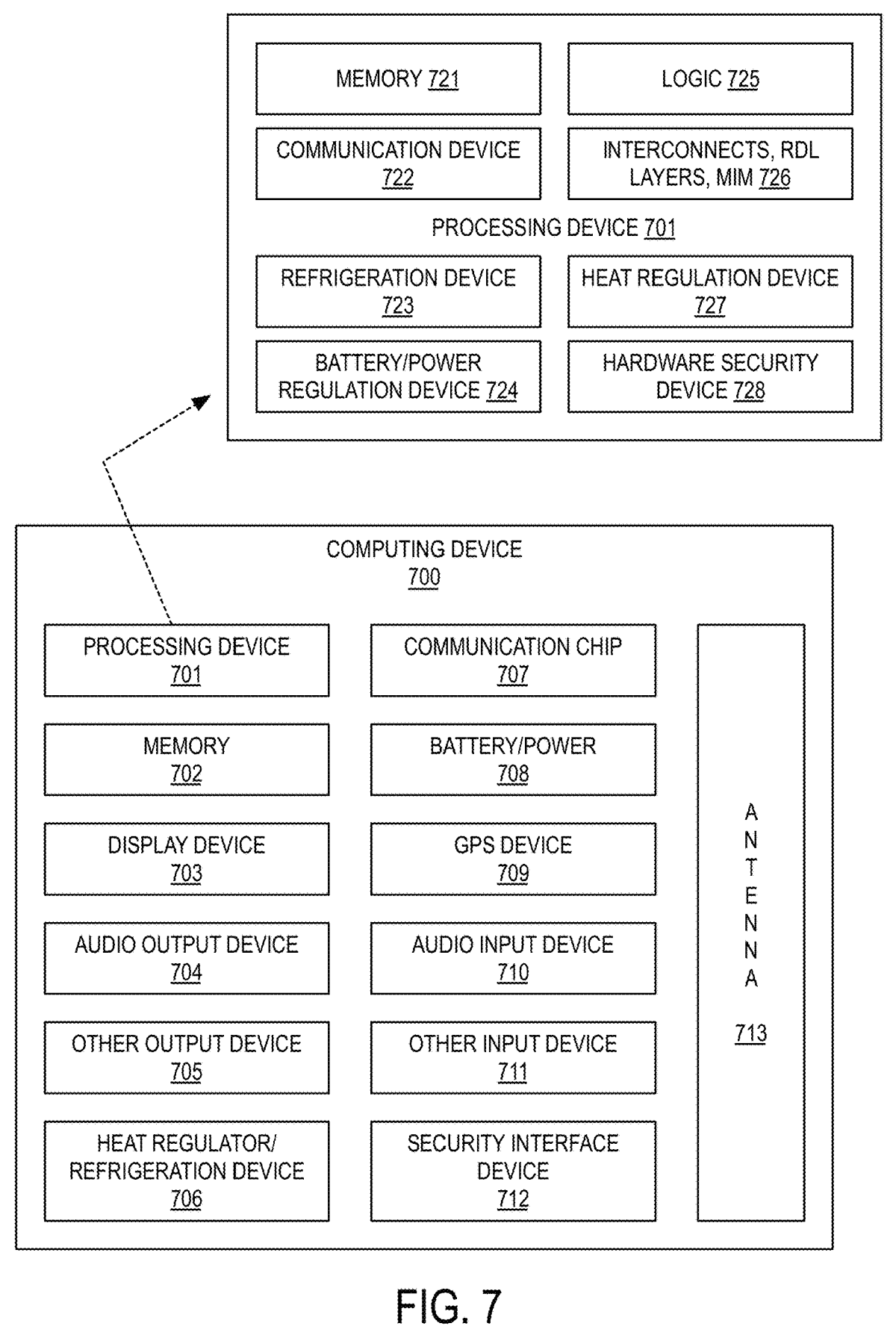

| | |
|---|---|
| MEMORY 721 | LOGIC 725 |
| COMMUNICATION DEVICE 722 | INTERCONNECTS, RDL LAYERS, MIM 726 |

PROCESSING DEVICE 701

| | |
|---|---|
| REFRIGERATION DEVICE 723 | HEAT REGULATION DEVICE 727 |
| BATTERY/POWER REGULATION DEVICE 724 | HARDWARE SECURITY DEVICE 728 |

COMPUTING DEVICE 700

| | |
|---|---|
| PROCESSING DEVICE 701 | COMMUNICATION CHIP 707 |
| MEMORY 702 | BATTERY/POWER 708 |
| DISPLAY DEVICE 703 | GPS DEVICE 709 |
| AUDIO OUTPUT DEVICE 704 | AUDIO INPUT DEVICE 710 |
| OTHER OUTPUT DEVICE 705 | OTHER INPUT DEVICE 711 |
| HEAT REGULATOR/ REFRIGERATION DEVICE 706 | SECURITY INTERFACE DEVICE 712 |

ANTENNA 713

FIG. 7

SEEDED GROWTH FOR 2D NANORIBBON TRANSISTORS

BACKGROUND

Performance and cost pressures drive a continuous and ever-increasing demand for denser, cheaper, and faster integrated circuit devices. To maintain the pace of increasing transistor density, device dimensions must continue shrinking. However, the performance of silicon transistors drops significantly at the nanometer scale. New materials may enable continued increases in transistor densities, clock speeds, and price efficiencies.

Yet, with new materials come new difficulties. Improved structures and methods, along with new materials, are needed to support continued device miniaturization.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIGS. 2A, 2B, 2C, 2D, 2E, 2F, and 2G illustrate isometric views of a transistor, including source and drain structures coupled by channel regions, at various stages of manufacture;

FIG. 3 illustrates an isometric view of a transistor on a substrate with top and bottom gate electrodes;

FIG. 4 illustrates an isometric view of a transistor with gate electrodes coupled to channel regions by high-K insulators, and a low-K insulator between gate electrodes and source and drain structures;

FIG. 7 is a block diagram of an example computing device, all in accordance with some embodiments.

DETAILED DESCRIPTION

Figure 1:
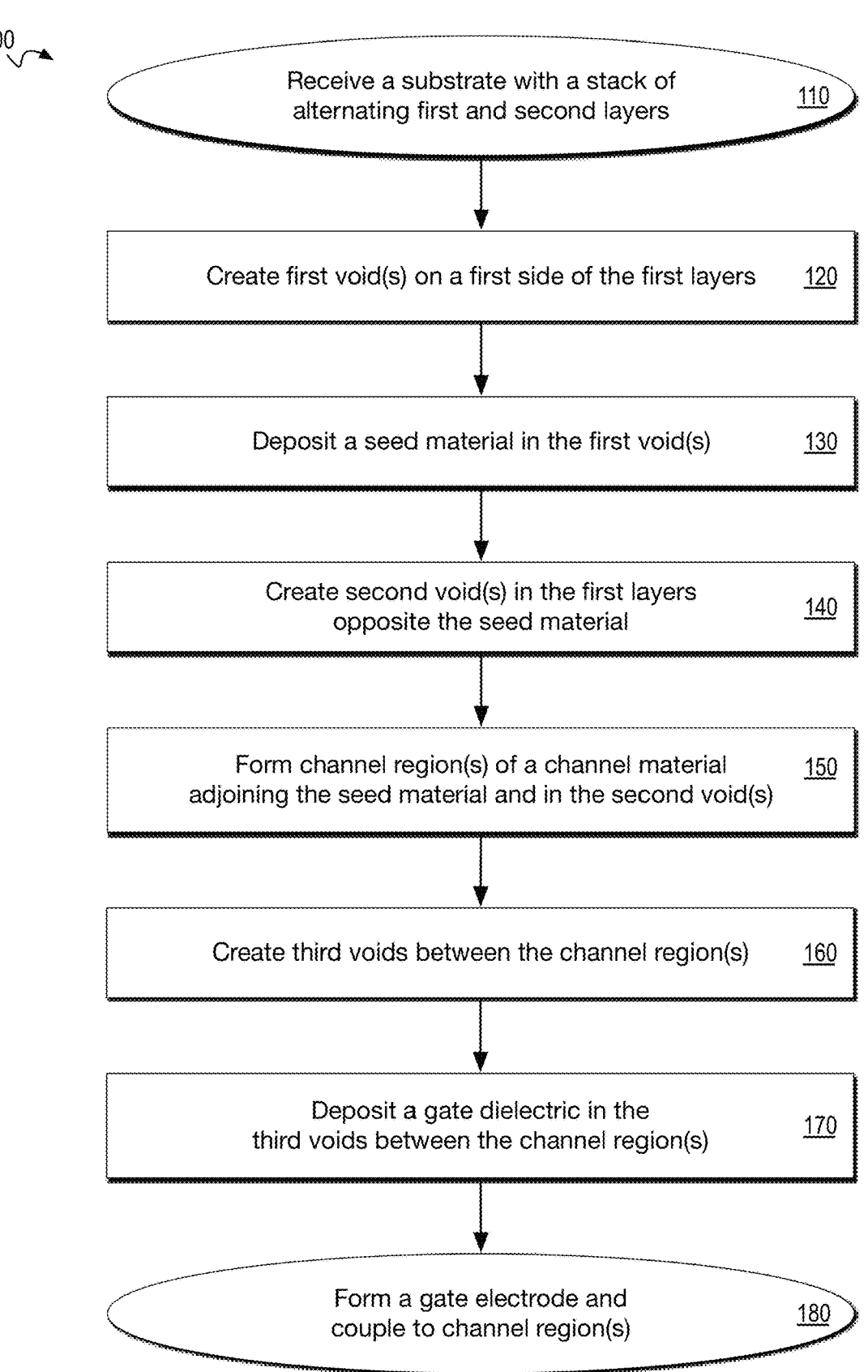
FIG. 1 illustrates various processes or methods for forming channel regions using a seed material, including nanoribbons of two-dimensional (2D) materials.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed for forming transistors having channels with high-quality, two-dimensional (2D) materials without (or without many) grain boundaries. Improved transistors may employ nanoribbons of 2D materials as channel regions in increasingly miniscule devices. However, 2D device performance is degraded by poor quality channel materials. Wafer-scale, crystal growth and transfer of 2D materials for use at the device-scale introduces potential, e.g., contamination or structural problems. Polycrystalline channel growth of 2D materials in transistors may result in degraded performance. Grain boundaries in polycrystalline growth occur where multiple, mismatched crystal lattices meet. To improve performance, polycrystalline growth and grain boundaries in channel regions must be prevented (or at least minimized).

Monocrystalline growth of 2D nanoribbons may be enabled by a seed material, which may enhance crystal formation by acting as a nucleation site from which a single crystal lattice may be initiated. RibbonFETs may be formed with multiple channels free of grain-boundaries. In some embodiments, ribbonFETs are formed with multiple single-grain channels and one or more channels with a grain boundary. In some such embodiments, a grain boundary is on an end of the channel opposite a seed material, further from a nucleation site.

2D nanoribbons may be atomically thin. Channel regions of 2D nanoribbons may be monocrystalline monolayers with thicknesses of less than 1 nm. While nanoribbons two or three monolayers thick are possible, the covalent bonding within a same monolayer inhibits bonding with atoms in another monolayer or vertical growth of the crystal lattice beyond an atomic plane of the monolayer. The natural tendency of planar lattice growth can be encouraged by confining the crystal growth to thin, vacated layers in a stack of layers. Voids may be only a nanometer thick and may be opened by removing thin sacrificial layers. Seed material may be deposited in such voids. Somewhat thicker sacrificial layers and subsequent voids may be formed, for example, to allow for better crystal growth. Monocrystal-line, 2D nanoribbons can grow laterally in the thin voids, for example, from a seed material and nucleation site on a source structure to a drain structure one channel length away. Other sacrificial layers (having an etch selectivity with the first, thin sacrificial layers) can be removed to facilitate the formation of gate structures, e.g., gate electrodes and gate dielectrics between the channel regions.

In some embodiments, the 2D materials are transition metal dichalcogenides (TMD). At least some TMD 2D materials are semiconducting, which enables TMD 2D channel regions in ribbonFETs. The transition metals may include all the elements of groups 4 through 11, the group 3 elements scandium and yttrium, and the inner transition metals (e.g., f-block lanthanide and actinide series). The chalcogens are the group 16 elements, but excluding oxygen. Notable chalcogens are sulfur, selenium, and tellurium.

FIG. 1 illustrates various processes or methods 100 for forming channel regions using a seed material, including nanoribbons of 2D materials, in accordance with some embodiments. FIG. 1 shows methods 100 that includes operations 110-180. Some operations shown in FIG. 1 may overlap with other operations. FIG. 1 shows an example sequence, but the operations can be done in other sequences as well, and some operations may be omitted. Some operations can also be performed multiple times before other operations are performed. Optional operations will be described. Methods 100 generally entail forming transistor channel regions by creating voids in a stack of alternating material layers, depositing a seed material in the voids, and forming channel regions adjoining the seed material. The channel regions may include a nanoribbon, which may be of a 2D material, e.g., a TMD, and have a thickness of only a monolayer.

FIGS. 2A, 2B, 2C, 2D, 2E, 2F, and 2G illustrate isometric views of a transistor 200, including source and drain structures 211, 212 coupled by channel regions 227, at various stages of manufacture, in accordance with some embodiments.

Returning to FIG. 1, in operation 110, a substrate is received with a stack of alternating layers over the substrate. The alternating layers may be between sidewalls, e.g., on two sides.

The substrate may be a die or wafer, e.g., of any suitable material or materials. The substrate may include a semiconductor material, including a crystalline material. In some examples, the substrate may include monocrystalline silicon (Si), germanium (Ge), silicon germanium (SiGe), a III-V alloy material (e.g., gallium arsenide (GaAs)), a silicon carbide (SIC), a sapphire ($Al_2O_3$), or any combination thereof. The substrate may be of any suitable semiconductor, insulator, or other material.

The alternating layers may be of two or more materials, at least one of which may be a sacrificial material. One or more first layers, meant to be replaced by a channel region (e.g., a nanoribbon), may be of a sacrificial material between second layers. The materials may be any suitable materials with an etch selectivity between them, for example, an oxide and a nitride (e.g., a silicon oxide, such as $SiO_2$, and a silicon nitride, such as $Si_3N_4$). The first layer(s) may advantageously have a very small thickness as channel region(s) are meant to be formed in voids opened up by removing the first layer(s). In some embodiments, one or more first layers have a thickness of less than 3 nm. Channel regions of smaller dimensions may be desired. In some embodiments, one or more first layers have a thickness of less than 1 nm. First layers with greater thicknesses (and consequently larger voids) may be desired, for example, to increase flow of precursor gases or otherwise improve crystal growth. In some embodiments, one or more first layers have a thickness of about 5 nm. The second (or other) layers may have greater thicknesses, e.g., to accommodate gate structures, including electrodes and dielectric materials.

Other materials may be above, below, or interspersed within the stack of sacrificial layers. For example, metallization structures may be included between the layers and may later be included within a gate structure. In some embodiments, a conductive structure is above or below the sacrificial layers and is meant to provide a gating function in a completed transistor structure. Such a conductive structure may be within an insulating material (e.g., so that it does not span between the sidewalls) or below an insulating material (e.g., so that it is insulated from the sidewalls, which may be source and drain structures over the conductive structure). Such materials or structures may be present upon receipt or may be absent upon receipt, but be fashioned after receipt.

The sidewalls may be conductive structures meant to be used as (or parts of) source and drain structures in a transistor. In some embodiments, the sidewalls are later replaced with source and drain structures. In some embodiments, sidewalls are on two sides of the alternating layers. In some embodiments, sidewalls are on four sides of the alternating layers. In some embodiments, one or more sidewalls are of a first material, and another one or more sidewalls are of a second material. In some such embodiments, the differing materials allow for removal of one or more sidewalls while maintaining others, etc. In some embodiments, a sidewall material is selected for the material's adsorption or sticking rates of, e.g., a seed material meant to be deposited on a sidewall.

Figures 2A, 2B:
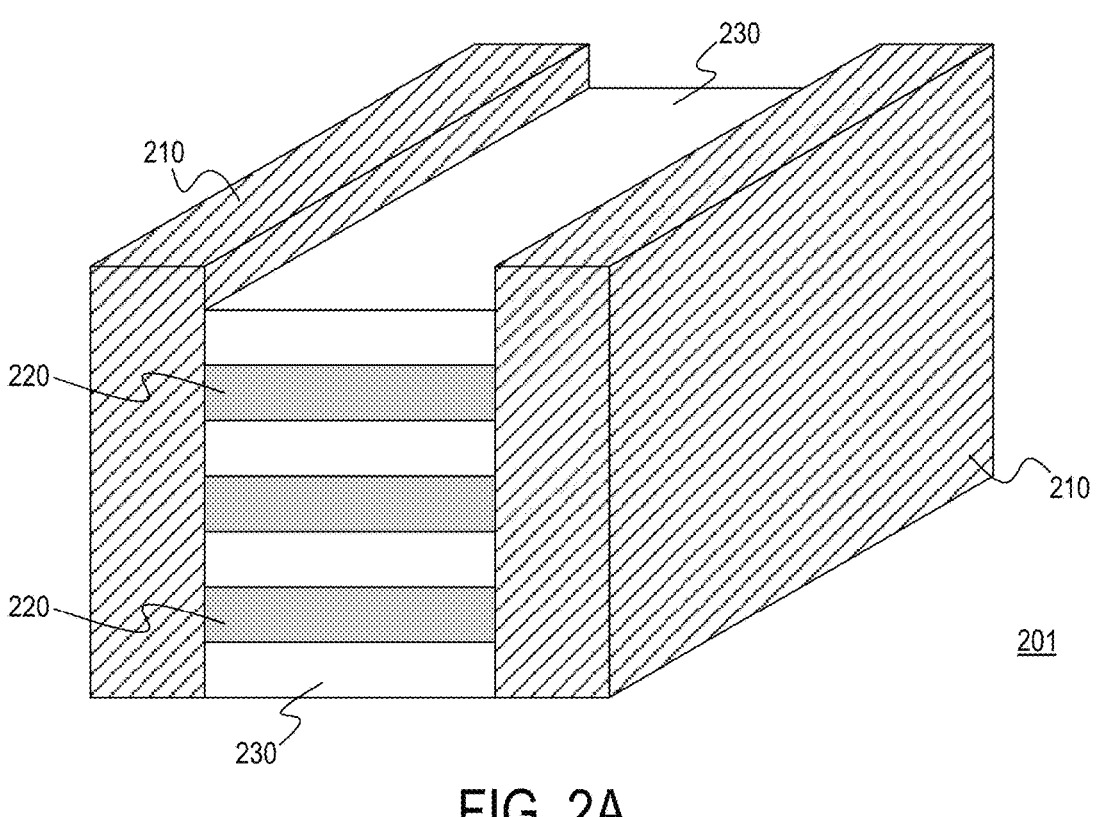

FIG. 2A shows a received substrate 201 (e.g., as may be received in operation 110 as described in FIG. 1) with a stack of alternating first and second layers 220, 230 between sidewalls 210 over substrate 201. In the example of FIG. 2A, sidewalls 210 are metallization structures and may be used as source and drain structures. In some embodiments, other sidewalls (not shown) are in front of and behind layers 220, 230. In some embodiments, layers 220, 230 continue in both y directions. In some embodiments, sidewalls (not shown) are in front of and behind layers 220, 230, and layers 220, 230 are received without sidewalls 210. Sidewalls 210 may have an etch selectivity between at least one of first and second layers 220, 230.

Substrate 201 may be an integrated circuit (IC) die and may be part of a wafer. Substrate 201 may include other layers or structures, e.g., between layers 220, 230. Such layers or structures may span between sidewalls 210 or may be between intervening material between sidewalls 210. Layers 220, 230 may have vastly different thicknesses (e.g., in the z direction).

Returning to processes or methods 100 in FIG. 1, one or more voids are formed at operation 120 by removing a portion of one or more first layers, e.g., on one side or end, such as adjacent a sidewall, and retaining another portion of the first layer(s). For example, an anisotropic etch may form a hole, e.g., down through first and second layers, to form voids in one or more first layers. In some such embodiments, the hole and voids may be on a sidewall adjoining the stack of alternating layers. The voids may be contiguous. For example, a vertical hole may be thought of as a single void spanning multiple layers or as multiple, contiguous voids with each layer having a void. In some embodiments, an isotropic etch that is selective to the first layer may remove a portion of the first layer in a stack that is open on one side, e.g., received without a sidewall on that side or where a sidewall is removed to expose a side of the stack. In some embodiments, multiple etches are combined. For example, an isotropic etch may selectively remove material from first layers after an anisotropic etch forms a vertical hole through first and second layers. An isotropic etch may be limited, e.g., in time, to retain a portion of the first layer(s). An anisotropic etch may be limited, e.g., to a footprint smaller than the area of the layer, to retain a portion of the first layer(s). A single, narrow etch may advantageously provide a smaller void for deposition of a seed material. A moreconfined seed deposition may advantageously provide a single, discrete nucleation site for monocrystalline formation of a channel material.

FIG. 2B illustrates substrate 201 with void(s) 221 in layers 220 between layers 230, for example, as may result from operation 120 as described in FIG. 1. In the example of FIG. 2B, sidewalls 210 are source and drain structures 211, 212. Although structures may be referred to as a source or drain in some examples, these labels are not restrictive and may be reversed in this and other embodiments. Void(s) 221 adjoin source structure 211, and are between source structure 211 and retained portions 222 of layers 220, and between layers 230. Hole 231 extends through layers 220, 230 along source structure 211. Although in the example of FIG. 2B, void(s) 221 extend laterally (in the y direction) along source structure 211 in layers 220 and between layers 230, void(s) 221 may be limited to vertical hole 231.

Returning to processes or methods 100, a seed material is deposited at operation 130 in one or more voids adjacent the retained portions in one or more first layers. The seed material may be deposited on a sidewall, a retained portion, an adjacent layer (e.g., a second layer), etc., by a chemical vapor deposition (CVD). In some embodiments, the seed material is deposited in the voids with an atomic layer deposition (ALD), which may conformally deposit the seed material on a sidewall or retained portion. The seed material may be deposited by other suitable means. Seed material deposition area may be restricted to define a desired nucleation site.

The seed material may aid in forming a channel region by providing a nucleation site for crystal growth (e.g., primary heterogenous nucleation) of a channel material. In some embodiments, the seed material is tungsten. In some embodiments, the seed material molybdenum. Other metals, for example, transition metals, may be suitable seed materials. In some embodiments, the seed material is a polymer. In some such embodiments, the seed material is copolymer, such as those used in directed self-assembly (DSA) processes. Advantageously, the seed material may improve adsorption of vapor precursors of a channel material. The seed material may also act as a source of a channel material precursor. In some such embodiments, a channel material precursor in a vapor phase may interact with the deposited seed (source) material to grow the channel region laterally. In some embodiments, the seed material is (or includes) a tungsten oxide, such as $WO_3$. In some embodiments, the seed material is (or includes) a molybdenum oxide, such as $MoO_3$. Oxides of tungsten or molybdenum may be more conveniently deposited than those of some other metals. Oxides of tungsten or molybdenum may function well as seed materials for desired channel materials (e.g., those that also include tungsten or molybdenum). Other seed materials may include other materials, such as other metal oxides. In some such embodiments, the metal is niobium, tantalum, rhenium, or ruthenium. Other seed materials may be suitable.

Figure 2C:
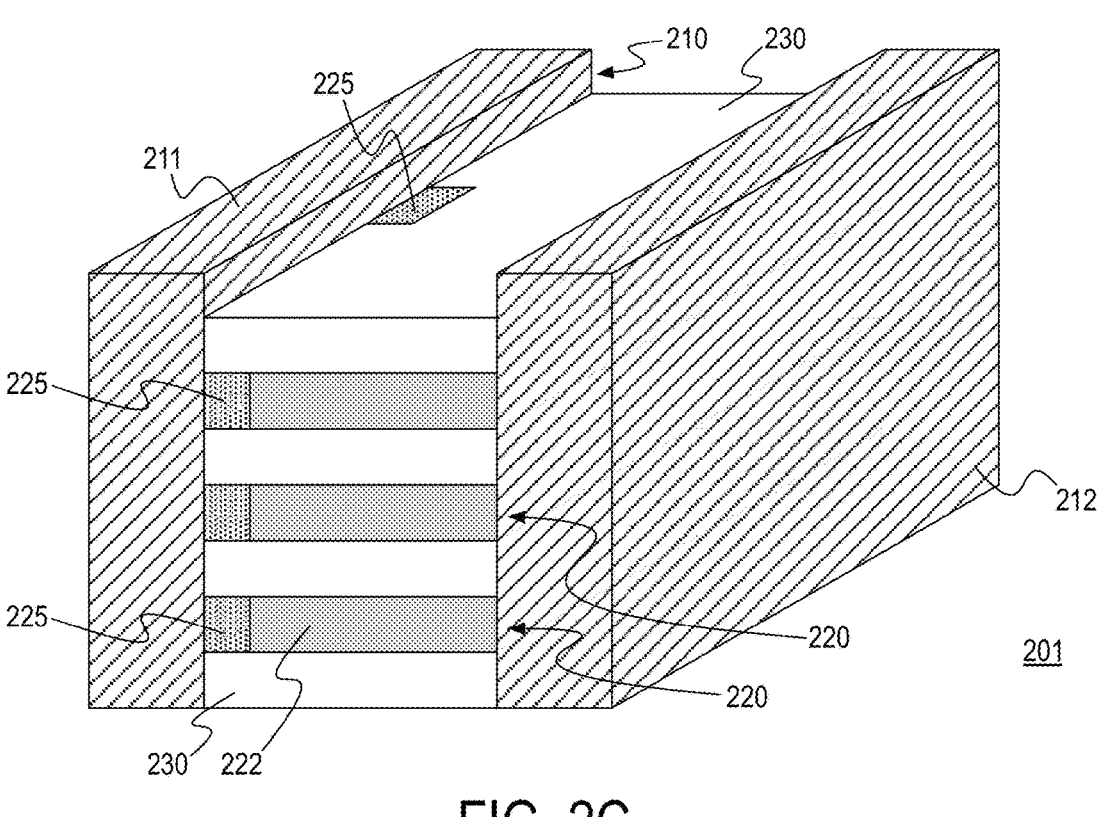

FIG. 2C shows substrate 201 with seed material 225 on retained portions 222 and source structure 211 in layers 220 between layers 230, e.g., following operation 130 as described in FIG. 1. In the example of FIG. 2C, seed material 225 is on sidewall 210 of source structure 211, including above layers 220. In some embodiments, minimal amounts of seed material 225 are deposited on sidewall 210, for example, only in a vertical region spanning first and second layers 220, 230 (e.g., the region of hole 231 in FIG.

2B). In some such embodiments, seed material 225 is deposited only on sidewall 210 and is not deposited on retained portions 222.

Returning to FIG. 1, one or more voids are formed at operation 140 by removing at least a portion of the material retained in one or more first layers. The voids may be formed on the side or end of the first layer(s) opposite the seed material, such as adjacent the other sidewall. The layers or structures immediately above and below a void may act as guides for lateral crystal growth of channel regions. In some embodiments, a first-layer void is between vertically adjacent second layers 3 nm apart or closer. Voids may advantageously have vertical clearance for only one monolayer of a channel material. In some embodiments, a first-layer void is between vertically adjacent second layers less than 1 nm apart.

Some or all of the retained portion in one or more first layers may be removed from the first layer(s) in much the same way as the material initially removed. For example, an anisotropic etch can form a vertical hole through first and second layers and into the side of the first layer(s) opposite the seed material, e.g., on drain structure, and an isotropic etch selective to the material of the first layers can remove the retained portion. In some embodiments, the end of the first layer(s) opposite the seed material can be exposed by removing, e.g., etching away, a sidewall opposite the seed material, and the retained portion of the first layer(s) can be removed as well. In some embodiments, the retained portion is removed by an etch selective to the first layers. In some embodiments, some seed material is also removed, e.g., recessed or etched back.

Figure 2D:
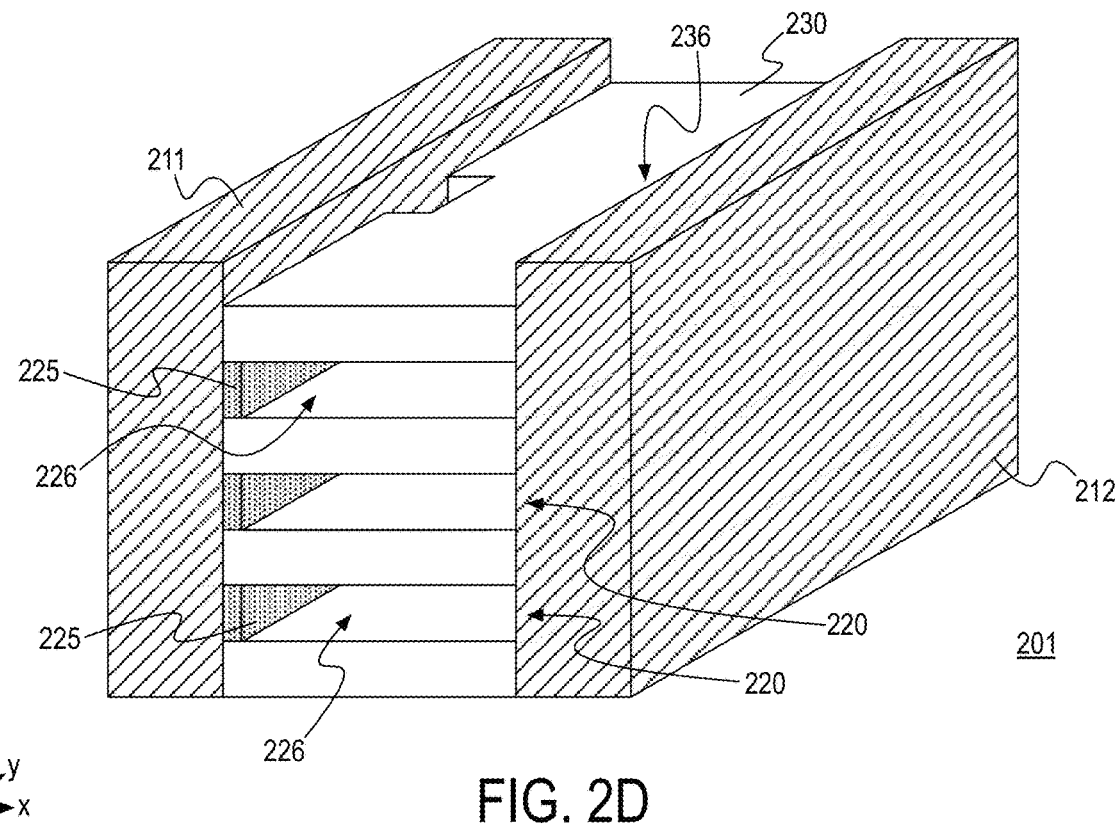

FIG. 2D illustrates substrate 201 with voids 226 adjacent seed material 225 in layers 220 between layers 230, for example, as may result from operation 140 as described in FIG. 1. A vertical hole 236 (obscured by drain structure 212) extends down along drain structure 212 and through first and second layers 220, 230 on a side opposite the seed material. Less seed material 225 is present in FIG. 2D than in FIG. 2C, e.g., on sidewall 210.

Returning to processes or methods 100 in FIG. 1, one or more channel regions are formed adjoining the seed material in the first-layer voids at operation 150. Channel regions may be formed by depositing a channel material by CVD, e.g., by ALD. Channel materials may be deposited by a metalorganic chemical vapor deposition (MOCVD). In some embodiments, the seed material initiates or enhances channel formation by acting as a nucleation site, e.g., for crystal formation. In some embodiments, the seed material improves adsorption of channel materials, e.g., precursors. In some embodiments, the seed material acts as a source material of a channel material precursor and reacts and combines with a channel material precursor in a vapor phase. A channel region may grow from the seed material and along a length of a void as channel material is deposited. The structures around the void, e.g., second layers, may confine the growth vertically and direct growth only laterally along the length of the first-layer void. In some embodiments, a channel region with a thickness of less than 1 nm grows from the seed material.

In some embodiments, a channel region includes a nanoribbon. In some such embodiments, the nanoribbon is of a 2D material. Atoms in crystalline 2D materials may covalently bond with other atoms within a same monolayer and not bond with atoms in another monolayer. For at least this reason, nanoribbon channel regions of 2D materials may grow laterally, rather than vertically, in crystalline monolayers within the voids and between, e.g., second layers. In some embodiments, a channel region has a thickness of a single monolayer. In some such embodiments, the channel region has a thickness of less than 1 nm. In some embodiments, a channel region is of a TMD material. The TMD may include a metal and a chalcogen, e.g., a non-oxygen element in Group 16, such as sulfur, selenium, or tellurium. In some embodiments, the TMD material includes tungsten and either sulfur or selenium (e.g., $WS_2$ or $WSe_2$). In some embodiments, the TMD material includes molybdenum and either sulfur or selenium (e.g., $MoS_2$ or $MoSe_2$). Semiconducting monolayers of $WS_2$, $WSe_2$, $MoS_2$, or $MoSe_2$ may be more stable, for example, in room temperature, non-inert environments, and may be more conveniently deposited than those of other 2D materials.

Some dimensions, for example, a length and width (e.g., in the x and y directions, respectively), of the nanoribbons may be adjusted to suit an application. For example, while nanoribbons with smaller dimensions may be desirable, e.g., to improve device density, some dimensions may be kept above certain thresholds to ensure satisfactory operation, e.g., at high frequencies and of sufficient conduction. Nanoribbons may be grown with a greater or lesser width to increase or decrease a channel region's conducting cross-sectional area and so to get a desired aggregate channel width for the transistor. A nanoribbon grown with a greater width may be a nanosheet, and a nanoribbon grown with a lesser width may be a nanowire. A nanoribbon length may be adjusted with nanoribbon width, e.g., to avoid short-channel effects.

Also, although the seed material enables and enhances monocrystalline formation, the likelihood of a channel region including multiple crystals may increase as the length of the channel region crystal growth increases. A channel region may be polycrystalline, even if it is monocrystalline along most of the channel region length, and have a grain boundary at an end of the channel region opposite the seed material. Grain boundaries may be more likely farther from the nucleation site.

Figure 2E:
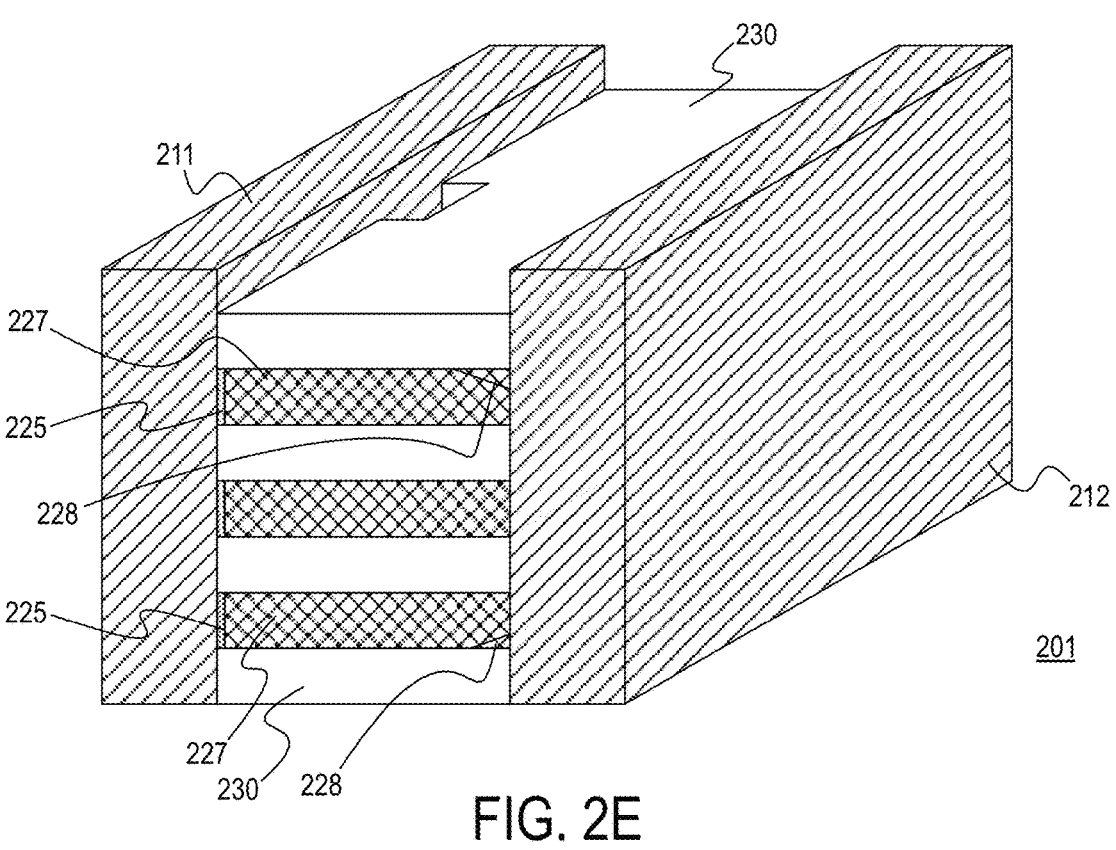

FIG. 2E shows substrate 201 with channel regions 227 adjoining seed material 225 in layers 220 between layers 230, e.g., following operation 150 as described in FIG. 1. In some embodiments, a channel region couples with the seed material and the opposite sidewall. In some such embodiments, the channel region is in direct contact with the opposite sidewall.

Channel regions 227 may include nanoribbons of a 2D material. Channel regions 227 may have a thickness (in the z direction) of a single monolayer. Channel regions 227 may be monocrystalline, as in one example of FIG. 2E. Channel regions 227 may include a grain boundary 228. In some embodiments, as in the example of FIG. 2E, a polycrystalline channel region 227 is substantially monocrystalline, but has a grain boundary 228 at an end of the channel region opposite the seed material, adjacent drain structure 212. Grain boundaries 228 may be more likely farther from a nucleation site, e.g., seed material 225.

Returning to FIG. 1, processes or methods 100 may optionally include opening voids between channel regions by removing at least a portion of one or more second layers at operation 160 and forming an insulator, e.g., a gate dielectric, in the voids at operation 170. An exposed second layer (or a portion of a second layer) may be removed at operation 160 using an etch selective to the second layer(s). In some embodiments, sidewalls may be removed to expose the second layer(s). In some embodiments, second layers are exposed on ends of the stack between the sidewalls. For example, if ends of the channel regions are coupled to source and drain structures, one or more sides of the channel regions may be exposed. An anisotropic or a selective etch may remove, e.g., a vertical structure to expose the layers between channel regions, if necessary. Voids may be formed between channel regions by other suitable means.

Insulators may be deposited over and between the channel regions at operation 170, e.g., as part of a gate structure, which may include a gate electrode. For example, a gate dielectric may be conformally deposited over the channel regions by CVD. In some embodiments, operations 160 and 170 are performed iteratively to remove first portions of second layers and replace them with a first insulator and then remove second portions of second layers and replace them with a second insulator. In some embodiments, low-K dielectrics are formed adjacent the source and drain structures and are meant to insulate a gate electrode from the source and drain structures. In some embodiments, high-K dielectrics are formed more centrally between the source and drain structures (or other sidewalls) and are meant to be a gate dielectric between a gate electrode and the channel regions. Gate insulators may be formed by other suitable means.

Figure 2F:
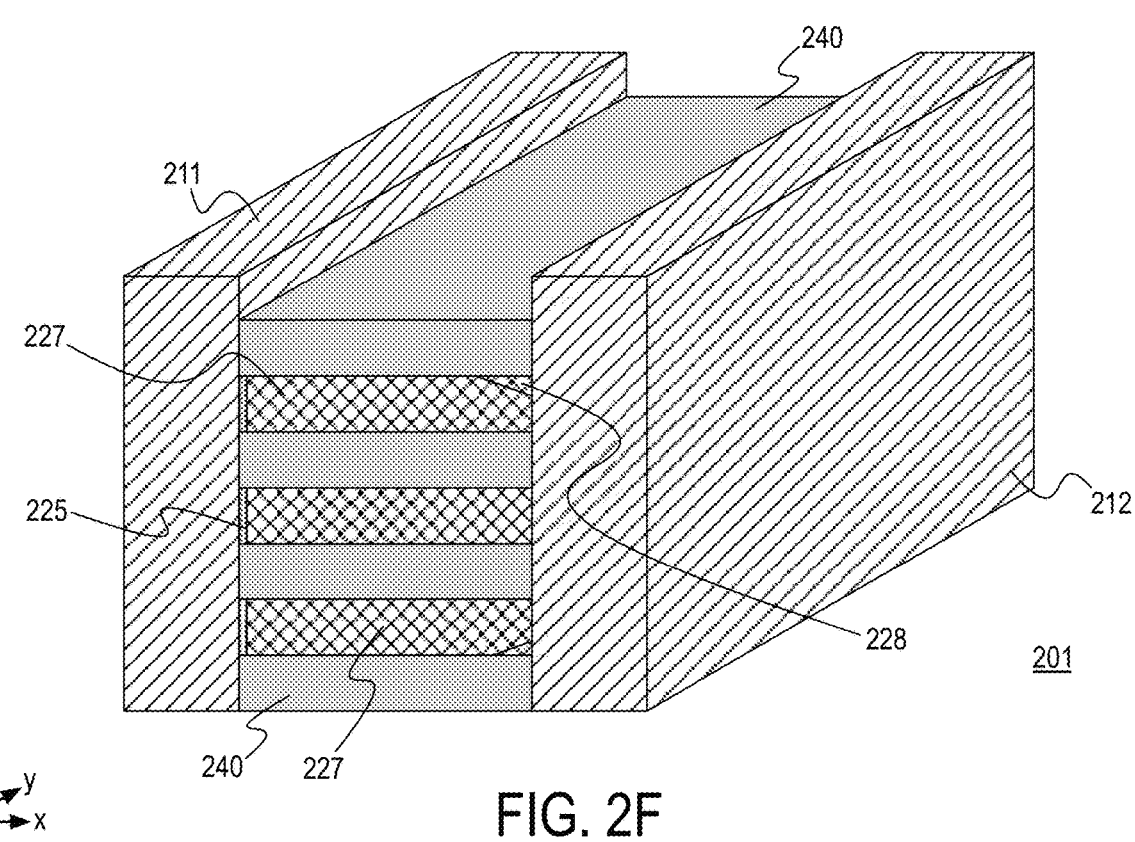

FIG. 2F illustrates substrate 201 with channel regions 227 adjoining seed material 225 in layers 220 between insulators 240, e.g., following operations 160 and 170 as described in FIG. 1. Second layers 230 are absent. In some embodiments, layers 230 remain, e.g., as gate dielectrics. Removing layers 230 may add processing flexibility, e.g., an opportunity to add gate electrodes along with, for example, internal to, insulators 240.

Returning to FIG. 1, a gate electrode is formed and coupled to one or more channel regions at operation 180, e.g., by depositing a metallization structure over gate dielectric layers adjacent the channel region(s). A gate structure may include a gate electrode over an uppermost channel region, under a lowermost channel region, and interspersed between channel regions. In some embodiments, metallization structure(s) are conformally deposited on gate dielectric layers formed between channel regions following removal of received second layers. In some such embodiments, a cap layer may be deposited over an uppermost second layer before removing one or more second layers in operation 160, and a gate dielectric layer may be conformally deposited on and between the cap layer and channel regions before conformally depositing metallization structure(s) of a gate electrode. Gate electrodes between channel regions may be coupled, e.g., on the sides of the channel regions, to form a gate all around the channel regions.

One or more portions, even most or all of a gate electrode, may be present before forming the channel region(s). For example, metallization structure(s) may be interleaved in the stack when the alternating layers are received (or formed). In some embodiments, a metallization structure is between, and separated from first layers by, intervening second layers between the first layers when received. Intervening metallization structures may be internal to, e.g., second layers when received or may be formed between or within insulators before or after channel regions are deposited. In some embodiments, gate electrodes are present prior to channel regions being formed, and gate electrodes are coupled to channel regions by the formation of the channel regions or by the deposition of a gate dielectric material between the gate electrodes and the channel regions. In some embodiments, gate electrodes are separated from sidewalls, e.g., source and drain structures, within third layers, for example, that include an insulating material with an etch selectivity between the first and second layers.

In some embodiments, one or more sidewalls are removed once or more during processes or methods 100, for example, to expose a side of the stack. Source and drain structures may be formed when the stack sides no longer need to be exposed. Source and drain structures may be formed after channel regions are. In some such embodiments, a source structure is coupled to channel regions by seed material, and a drain structure directly contacts channel regions. In some embodiments, source and drain structures may be coupled to channel regions, for example, by an interface layer of contact metal. In some embodiments, source and drain structures are formed before channel regions are, a source structure is coupled to channel regions by seed material, and a drain structure is coupled to channel regions when the channel regions grow to the drain structure.

FIG. 2G shows transistor 200 on substrate 201 and gate electrodes 250 coupled to channel regions 227, e.g., following operations 170 and 180 as described in FIG. 1. Channel regions 227 are between and coupled to source and drain structures 211, 212. Channel regions 227 are nanoribbons with a thickness of a single monolayer. Seed material 225 is between channel regions 227 and source structure 211. In the example of FIG. 2G, seed material 225 separates channel regions 227 and source structure 211, and is directly on channel regions 227 and a sidewall 210 of source structure 211. Channel regions 227 are directly on drain structure 212.

Gate electrodes 250 are within insulators 240, between channel regions 227, between source and drain structures 211, 212. In some embodiments, gate electrodes 250 are coupled (e.g., in front and behind the structure seen in FIG. 2G) and form an integrated gate around all of channel regions 227. In some embodiments, insulators 240 are high-K gate dielectrics between gate electrodes 250 and channel regions 227. For example, insulators 240 may include hafnium oxide, lanthanum oxide, zirconium oxide, tantalum oxide, titanium oxide, barium strontium titanium oxide, barium titanium oxide, strontium titanium oxide, yttrium oxide, aluminum oxide, etc.

Channel region 227B is monocrystalline and has no grain boundaries 228. Channel regions 227A, 227C are substantially monocrystalline, but have grain boundaries 228 adjacent drain structure 212, on ends of channel regions 227A, 227C opposite source structure 211 and seed material 225.

In the example of FIG. 2G, channel regions 227 are of TMD. In some embodiments, channel regions 227 include one of tungsten or molybdenum and one of sulfur, selenium, or tellurium.

In some embodiments, seed material 225 includes metal, e.g., a transition metal, such as tungsten or molybdenum. In some such embodiments, seed material 225 includes oxygen, for example, in a tungsten oxide (such as $WO_3$) or a molybdenum oxide (such as $MoO_3$).

FIG. 3 illustrates an isometric view of transistor 200 on substrate 201 with top and bottom gate electrodes 250, in accordance with some embodiments. In some embodiments, channel regions 227 may be formed over bottom gate electrode 250, and top gate electrode 250 may be formed after channel regions 227. In some embodiments, single channel region 227 is formed before or after bottom and top gate electrodes 250. In some such embodiments, a process is repeated iteratively to form gate electrodes 250 between channel regions 227 in a stack. Top and bottom gate electrodes 250 may be coupled, e.g., in front of and behind the structure shown.

Seed material 225 may be vertically unaligned with a corresponding channel region 227, e.g., either somewhat above or below. In some embodiments, seed material 225 may only be on source structure 211 at a single point, for example, centrally, along a width of corresponding channel region 227 (e.g., the region of hole 231 in FIG. 2B). In some such embodiments, seed material 225 may have the same vertical position as shown relative to corresponding channel region 227. In some embodiments, one or more channel regions 227 directly contact source structure 211.

FIG. 4 illustrates an isometric view of transistor 200 with gate electrodes 250 coupled to channel regions 227 by high-K insulators 240 and low-K insulator 444 between gate electrodes 250 and source and drain structures 211, 212, in accordance with some embodiments.

Transistor 200 may be over layers on substrate 201, for example, layers 422, 455. Back-gate layer 455 is insulated from source and drain structures 211, 212 by insulating layer 422.

Figure 5:
FIG. 5 illustrates an isometric view of an integrated circuit (IC) device with a transistor and a substrate coupled to a system substrate.

FIG. 5 illustrates an isometric view of IC device 500 with transistor 200 and substrate 201 coupled to a system substrate 599, in accordance with some embodiments. Substrate 201, which may be an IC die, is coupled to a power supply by system substrate 599. Transistor 200 on substrate 201 includes channel regions 227 with TMD monolayer nanoribbons adjoining seed material 225, as discussed herein. One or more channel regions 227 are separated from source structure 211 by seed material 225. One or more channel regions 227 directly contact source structure 211. One or more channel regions 227 directly contact seed material 225 and source and drain structures 211, 212.

System substrate 599 may be any host component with interconnect interfaces coupled to substrate 201, such as a package substrate or interposer, another IC die, etc. System substrate 599 may itself be an IC die. System substrate 599 may bond to another host component, such as a package substrate or interposer, an IC die, etc.

Figure 6:
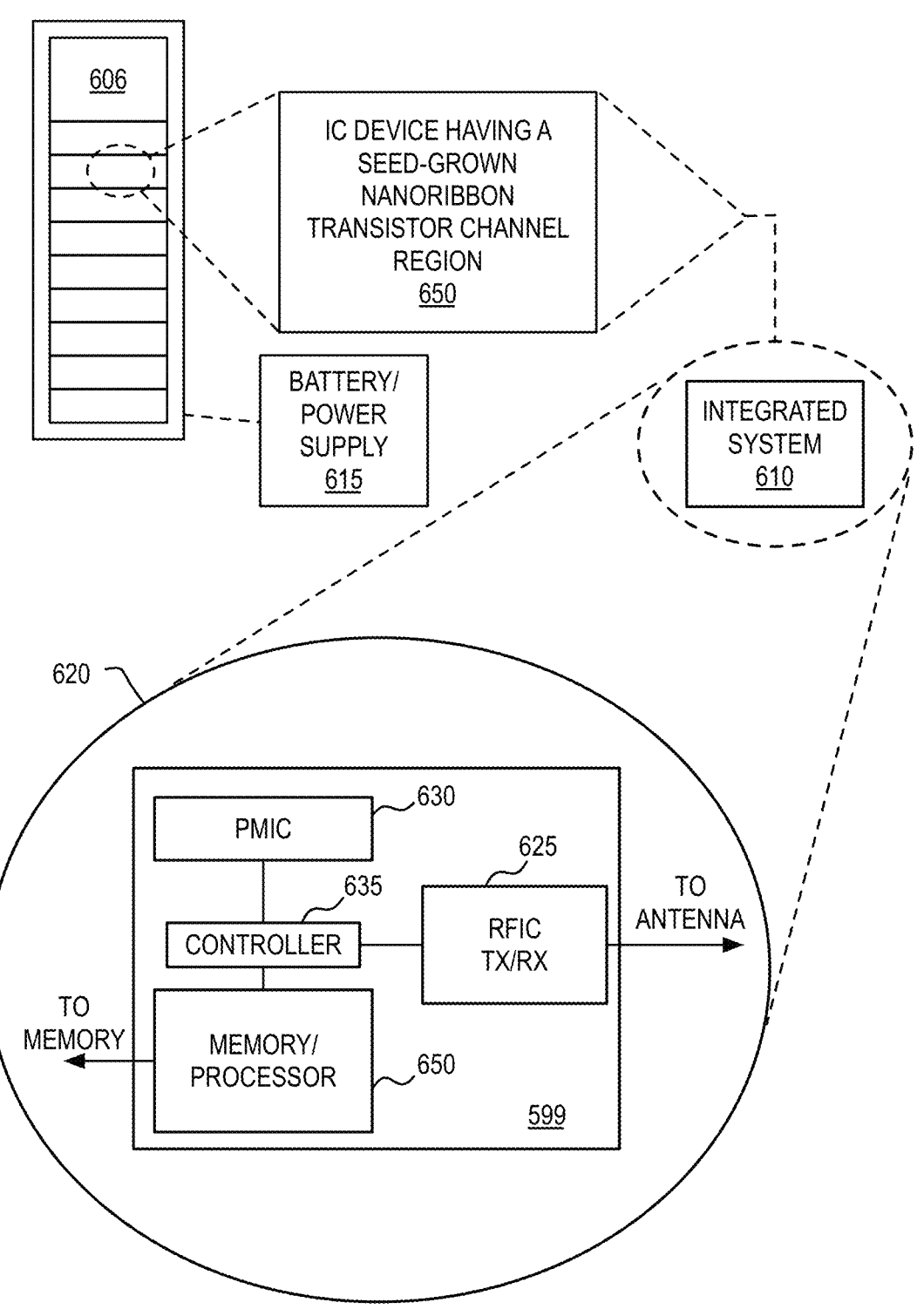
FIG. 6 illustrates a diagram of an example data server machine employing an IC device having a seed-grown nanoribbon transistor channel region.

FIG. 6 illustrates a diagram of an example data server machine 606 employing an IC device having a seed-grown nanoribbon transistor channel region, in accordance with some embodiments. Server machine 606 may be any commercial server, for example, including any number of high-performance computing platforms disposed within a rack and networked together for electronic data processing, which in the exemplary embodiment includes one or more devices 650 having an IC device with a seed-grown nanoribbon transistor channel region.

Server machine 606 includes a battery and/or power supply 615 to provide power to devices 650, and to provide, in some embodiments, power delivery functions such as power regulation. Devices 650 may be deployed as part of a package-level integrated system 610. Integrated system 610 is further illustrated in the expanded view 620. In the exemplary embodiment, devices 650 (labeled "Memory/ Processor") includes at least one memory chip (e.g., RAM), and/or at least one processor chip (e.g., a microprocessor, a multi-core microprocessor, or graphics processor, or the like) having the characteristics discussed herein. In an embodiment, device 650 is a microprocessor including an SRAM cache memory. As shown, device 650 may include an IC device having a seed-grown nanoribbon transistor channel region, as discussed herein. Device 650 may be further coupled to (e.g., communicatively coupled to) a board, an interposer, or system substrate 599 along with, one or more of a power management IC (PMIC) 630, RF (wireless) IC (RFIC) 625, including a wideband RF (wireless) transmitter and/or receiver (TX/RX) (e.g., including a digital baseband and an analog front end module further includes a power amplifier on a transmit path and a low noise amplifier on a receive path), and a controller 635 thereof. In some embodiments, RFIC 625, PMIC 630, controller 635, and device 650 include an IC device having a seed-grown nanoribbon transistor channel region.

FIG. 7 is a block diagram of an example computing device 700, in accordance with some embodiments. For example, one or more components of computing device 700 may include any of the devices or structures discussed herein. A number of components are illustrated in FIG. 7 as being included in computing device 700, but any one or more of these components may be omitted or duplicated, as suitable for the application. In some embodiments, some or all of the components included in computing device 700 may be attached to one or more printed circuit boards (e.g., a motherboard). In some embodiments, various ones of these components may be fabricated onto a single system-on-a-chip (SoC) die. Additionally, in various embodiments, computing device 700 may not include one or more of the components illustrated in FIG. 7, but computing device 700 may include interface circuitry for coupling to the one or more components. For example, computing device 700 may not include a display device 703, but may include display device interface circuitry (e.g., a connector and driver circuitry) to which display device 703 may be coupled. In another set of examples, computing device 700 may not include an audio output device 704, other output device 705, global positioning system (GPS) device 709, audio input device 710, or other input device 711, but may include audio output device interface circuitry, other output device interface circuitry, GPS device interface circuitry, audio input device interface circuitry, audio input device interface circuitry, to which audio output device 704, other output device 705, GPS device 709, audio input device 710, or other input device 711 may be coupled.

Computing device 700 may include a processing device 701 (e.g., one or more processing devices). As used herein, the term "processing device" or "processor" indicates a device that processes electronic data from registers and/or memory to transform that electronic data into other electronic data that may be stored in registers and/or memory (e.g., SRAM). Processing device 701 may include a memory 721, a communication device 722, a refrigeration device 723, a battery/power regulation device 724, logic 725, interconnects 726 (i.e., optionally including redistribution layers (RDL) or metal-insulator-metal (MIM) devices), a heat regulation device 727, and a hardware security device 728.

Processing device 701 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 700 may include a memory 702, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 702 includes memory that shares a die with processing device 701. This memory may be used as cache memory and may include embedded dynamic random-access memory (eDRAM) or spin transfer torque magnetic random-access memory (STT-M RAM).

Computing device 700 may include a heat regulation/ refrigeration device 706. Heat regulation/refrigeration device 706 may maintain processing device 701 (and/or other components of computing device 700) at a predetermined low temperature during operation.

In some embodiments, computing device 700 may include a communication chip 707 (e.g., one or more communication chips). For example, the communication chip 707 may be configured for managing wireless communications for the transfer of data to and from computing device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 707 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 707 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network.

Communication chip 707 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 707 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 707 may operate in accordance with other wireless protocols in other embodiments. Computing device 700 may include an antenna 713 to facilitate wireless communications and/or to receive other wireless communications (such as AM or FM radio transmissions).

In some embodiments, communication chip 707 may manage wired communications, such as electrical, optical, or any other suitable communication protocols (e.g., the Ethernet). As noted above, communication chip 707 may include multiple communication chips. For instance, a first communication chip 707 may be dedicated to shorter-range wireless communications such as Wi-Fi or Bluetooth, and a second communication chip 707 may be dedicated to longer-range wireless communications such as GPS, EDGE, GPRS, CDMA, WiMAX, LTE, EV-DO, or others. In some embodiments, a first communication chip 707 may be dedicated to wireless communications, and a second communication chip 707 may be dedicated to wired communications.

Computing device 700 may include battery/power circuitry 708. Battery/power circuitry 708 may include one or more energy storage devices (e.g., batteries or capacitors) and/or circuitry for coupling components of computing device 700 to an energy source separate from computing device 700 (e.g., AC line power).

Computing device 700 may include a display device 703 (or corresponding interface circuitry, as discussed above). Display device 703 may include any visual indicators, such as a heads-up display, a computer monitor, a projector, a touchscreen display, a liquid crystal display (LCD), a light-emitting diode display, or a flat panel display, for example.

Computing device 700 may include an audio output device 704 (or corresponding interface circuitry, as discussed above). Audio output device 704 may include any device that generates an audible indicator, such as speakers, headsets, or earbuds, for example.

Computing device 700 may include an audio input device 710 (or corresponding interface circuitry, as discussed above). Audio input device 710 may include any device that generates a signal representative of a sound, such as microphones, microphone arrays, or digital instruments (e.g., instruments having a musical instrument digital interface (MIDI) output).

Computing device 700 may include a GPS device 709 (or corresponding interface circuitry, as discussed above). GPS device 709 may be in communication with a satellite-based system and may receive a location of computing device 700, as known in the art.

Computing device 700 may include other output device 705 (or corresponding interface circuitry, as discussed above). Examples of the other output device 705 may include an audio codec, a video codec, a printer, a wired or wireless transmitter for providing information to other devices, or an additional storage device.

Computing device 700 may include other input device 711 (or corresponding interface circuitry, as discussed above). Examples of the other input device 711 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 700 may include a security interface device 712. Security interface device 712 may include any device that provides security measures for computing device 700 such as intrusion detection, biometric validation, security encode or decode, access list management, malware detection, or spyware detection.

Computing device 700, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-7. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a transistor includes a source structure and a drain structure, a plurality of channel regions between and coupled to the source and drain structures, wherein an individual one of the channel regions includes a first material and a second material between the first material and one of the source or drain structures, the first material including a metal and a chalcogen, and a gate electrode coupled to the channel regions.

In one or more second embodiments, further to the first embodiments, the second material is directly on the first material and the one of the source or drain structures.

In one or more third embodiments, further to the first or second embodiments, the second material is on a sidewall of the source or drain structure.

In one or more fourth embodiments, further to the first through third embodiments, the second material separates the first material and the one of the source or drain structure.

In one or more fifth embodiments, further to the first through fourth embodiments, the first material is in direct contact with a second of the source or drain structures.

In one or more sixth embodiments, further to the first through fifth embodiments, the first material includes the metal and the chalcogen in a crystalline structure.

In one or more seventh embodiments, further to the first through sixth embodiments, an individual one of the channel regions includes a grain boundary adjacent the second of the source or drain structures, distal the second material.

In one or more eighth embodiments, further to the first through seventh embodiments, the first material in an individual one of the channel regions has a thickness of less than 1 nm.

In one or more ninth embodiments, further to the first through eighth embodiments, the metal is tungsten or molybdenum.

In one or more tenth embodiments, further to the first through ninth embodiments, the second material includes tungsten or molybdenum.

In one or more eleventh embodiments, an integrated circuit (IC) device includes a power supply coupled to an IC die by a system substrate, and a transistor on the IC die, the transistor including a source structure coupled to a drain structure by a plurality of channel regions, wherein an individual one of the channel regions includes a first material, the first material including a metal and a chalcogen, and a second material is between one of the source and drain structures and an individual one of the channel regions, and a gate structure adjacent the channel regions.

In one or more twelfth embodiments, further to the eleventh embodiments, the second material is on a sidewall of the source or drain structure.

In one or more thirteenth embodiments, further to the eleventh or twelfth embodiments, the first material directly contacts the second material, the source structure, and the drain structure.

In one or more fourteenth embodiments, further to the eleventh through thirteenth embodiments, the first material in an individual one of the channel regions has a thickness of less than 1 nm.

In one or more fifteenth embodiments, a method includes receiving a stack of first and second layers over a substrate, creating one or more first voids on a first side of the first layers by removing first portions of the first layers and retaining second portions of the first layers, depositing a first material in the first voids, wherein the first material adjoins the second portions, creating one or more second voids adjacent the first material by removing the second portions, and forming one or more channel regions of a second material in the second voids, wherein the second material includes a metal and a chalcogen, and the second material adjoins the first material.

In one or more sixteenth embodiments, further to the fifteenth embodiments, forming a channel region includes forming a nanoribbon of the second material.

In one or more seventeenth embodiments, further to the fifteenth or sixteenth embodiments, the method also includes coupling a gate structure to one or more channel regions.

In one or more eighteenth embodiments, further to the fifteenth through seventeenth embodiments, coupling the gate structure to one or more channel regions includes creating one or more third voids between the channel regions and forming a gate dielectric in the third voids.

In one or more nineteenth embodiments, further to the fifteenth through eighteenth embodiments, the metal is tungsten or molybdenum.

In one or more twentieth embodiments, further to the fifteenth through nineteenth embodiments, the first material includes tungsten or molybdenum.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A transistor, comprising:
a source structure and a drain structure;
a plurality of channel regions between and coupled to the source and drain structures, wherein an individual one of the channel regions comprises a first material and a second material between the first material and one of the source or drain structures, the first material comprising a metal and a chalcogen; and
a gate electrode coupled to the channel regions.

2. The transistor of claim 1, wherein the second material is directly on the first material and the one of the source or drain structures.

3. The transistor of claim 1, wherein the second material is on a sidewall of the source or drain structure.

4. The transistor of claim 1, wherein the second material separates the first material and the one of the source or drain structure.

5. The transistor of claim 1, wherein the first material is in direct contact with a second of the source or drain structures.

6. The transistor of claim 1, wherein the first material comprises the metal and the chalcogen in a crystalline structure.

7. The transistor of claim 6, wherein an individual one of the channel regions comprises a grain boundary adjacent the second of the source or drain structures, distal the second material.

8. The transistor of claim 1, wherein the first material in an individual one of the channel regions has a thickness of less than 1 nm.

9. The transistor of claim 1, wherein the metal is tungsten or molybdenum.

10. The transistor of claim 1, wherein the second material comprises tungsten or molybdenum.

11. An integrated circuit (IC) device, comprising:

a power supply coupled to an IC die by a substrate; and a transistor on the IC die, the transistor comprising:

a source structure coupled to a drain structure by a plurality of channel regions, wherein an individual one of the channel regions comprises a first material, the first material comprising a metal and a chalcogen, and a second material is between one of the source and drain structures and an individual one of the channel regions; and a gate structure adjacent the channel regions.

12. The IC device of claim 11, wherein the second material is on a sidewall of the source or drain structure.

13. The IC device of claim 12, wherein the first material directly contacts the second material, the source structure, and the drain structure.

14. The IC device of claim 13, wherein the first material in an individual one of the channel regions has a thickness of less than 1 nm.

15. A method, comprising:

receiving a stack of first and second layers over a substrate;

creating one or more first voids on a first side of the first layers by removing first portions of the first layers and retaining second portions of the first layers;

depositing a first material in the first voids, wherein the first material adjoins the second portions;

creating one or more second voids adjacent the first material by removing the second portions; and forming one or more channel regions of a second material in the second voids, wherein the second material comprises a metal and a chalcogen, and the second material adjoins the first material.

16. The method of claim 15, wherein forming a channel region comprises forming a nanoribbon of the second material.

17. The method of claim 15, further comprising coupling a gate structure to one or more channel regions.

18. The method of claim 17, wherein coupling the gate structure to one or more channel regions comprises creating one or more third voids between the channel regions and forming a gate dielectric in the third voids.

19. The method of claim 15, wherein the metal is tungsten or molybdenum.

20. The method of claim 15, wherein the first material comprises tungsten or molybdenum.

\*  \*  \*  \*  \*